United States Patent [19]
Frantz et al.

[11] Patent Number: 4,717,219
[45] Date of Patent: Jan. 5, 1988

[54] ELECTRICAL CONNECTOR AND ASSEMBLY EYELETS

[75] Inventors: Robert H. Frantz, Newville; James A. Paulo, Harrisburg; Robert N. Whiteman, Jr., Middletown, all of Pa.

[73] Assignee: AMP Incorporated, Harrisburg, Pa.

[21] Appl. No.: 876,017

[22] Filed: Jun. 19, 1986

[51] Int. Cl.⁴ .............................................. H01R 9/09
[52] U.S. Cl. ......................................... 439/82; 411/57
[58] Field of Search .......... 339/17 LC, 17 C, DIG. 1, 339/17 LM, 17 M; 411/44, 45, 57, 59; 29/861, 864

[56] References Cited
U.S. PATENT DOCUMENTS

| 3,162,086 | 12/1964 | Wells et al. | 411/44 |
| 3,438,302 | 4/1969 | Sandor | 411/57 |
| 3,778,755 | 12/1973 | Marks | 339/220 R |
| 3,980,367 | 9/1976 | Laserson et al. | 339/17 R |
| 4,193,108 | 3/1980 | Romano | 361/339 |
| 4,435,031 | 3/1984 | Black et al. | 339/17 LC |
| 4,533,075 | 8/1985 | Hallock et al. | 227/55 |

FOREIGN PATENT DOCUMENTS 551561  6/1932  Fed. Rep. of Germany ........ 411/57
956098  6/1962  United Kingdom ................. 411/57

Primary Examiner—William R. Briggs
Attorney, Agent, or Firm—Adrian J. LaRue; David L. Smith

[57] ABSTRACT

An electrical connector assembly (12, 17) including means (17) for securing the connector assembly to a printed circuit board (11). The electrical connector housing (12) has an eyelet (17) disposed in an aperture (12b) in a mounting flange (12c) in an interference fit. The eyelet (17) has a flange (21) engaging the mounting flange (12c) of the housing (12), an inverted conical end (18b; 30b) remote from the flange (21) and a generally tubular shank (20, 23; 32, 30) extending therebetween. A first section (20) of the shank provides the interference fit with the aperture (12b). A second section (23) of the shank extends below the mounting flange for disposition within an aperture (11a) in the printed circuit board (11). The second section (23) may be tapered or of a smaller diameter than the first section (20). The inverted conical end (30b) is splayed or expanded into contact with the printed circuit board (11), by activation through the bore (22) of tubular shank (20, 23; 32, 30), to secure the electrical connector assembly (12, 17) to the printed circuit board (11).

17 Claims, 12 Drawing Figures

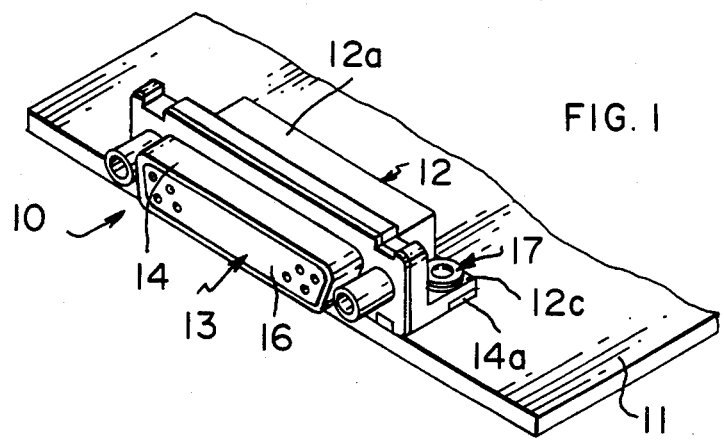
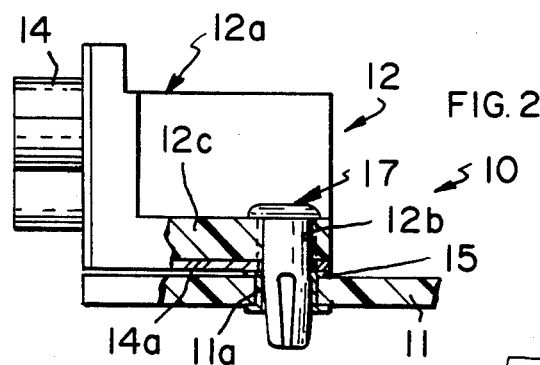
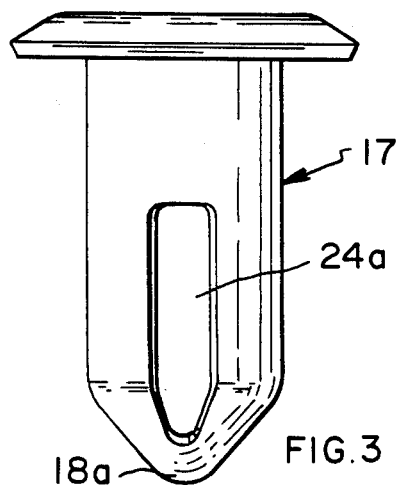
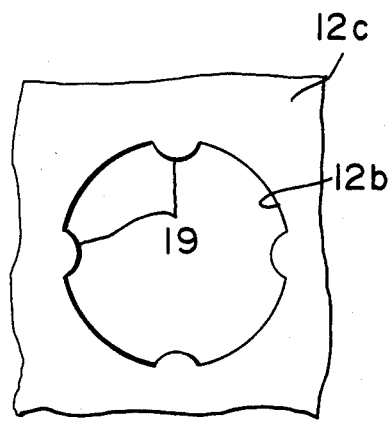
FIG. 1
FIG. 2
FIG. 2a
FIG. 3

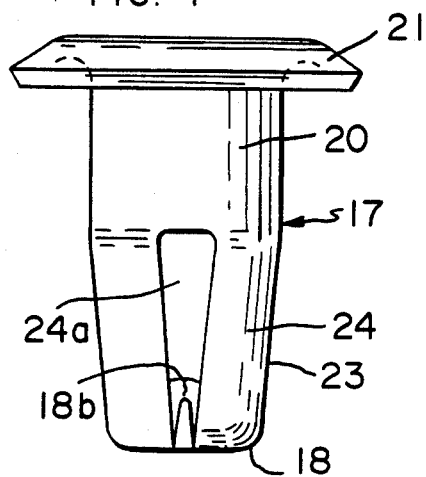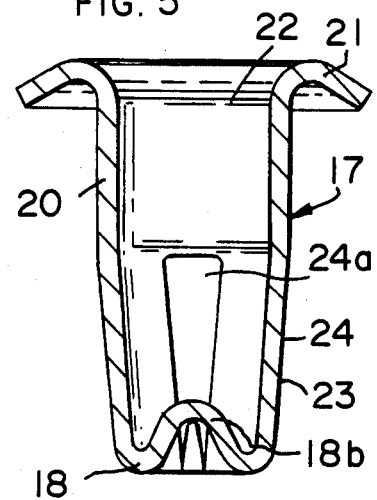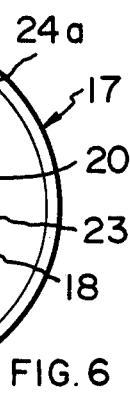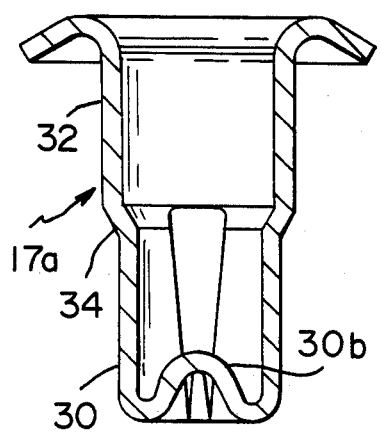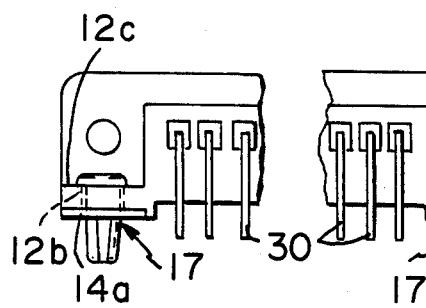

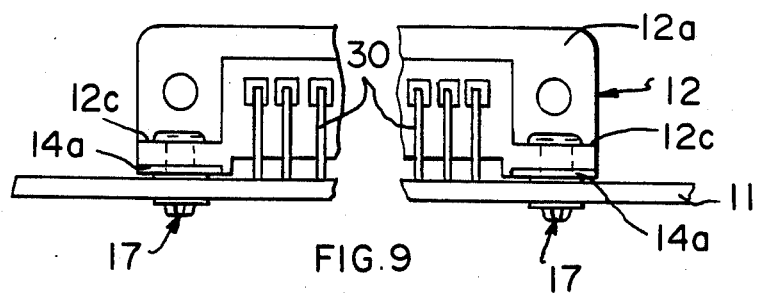
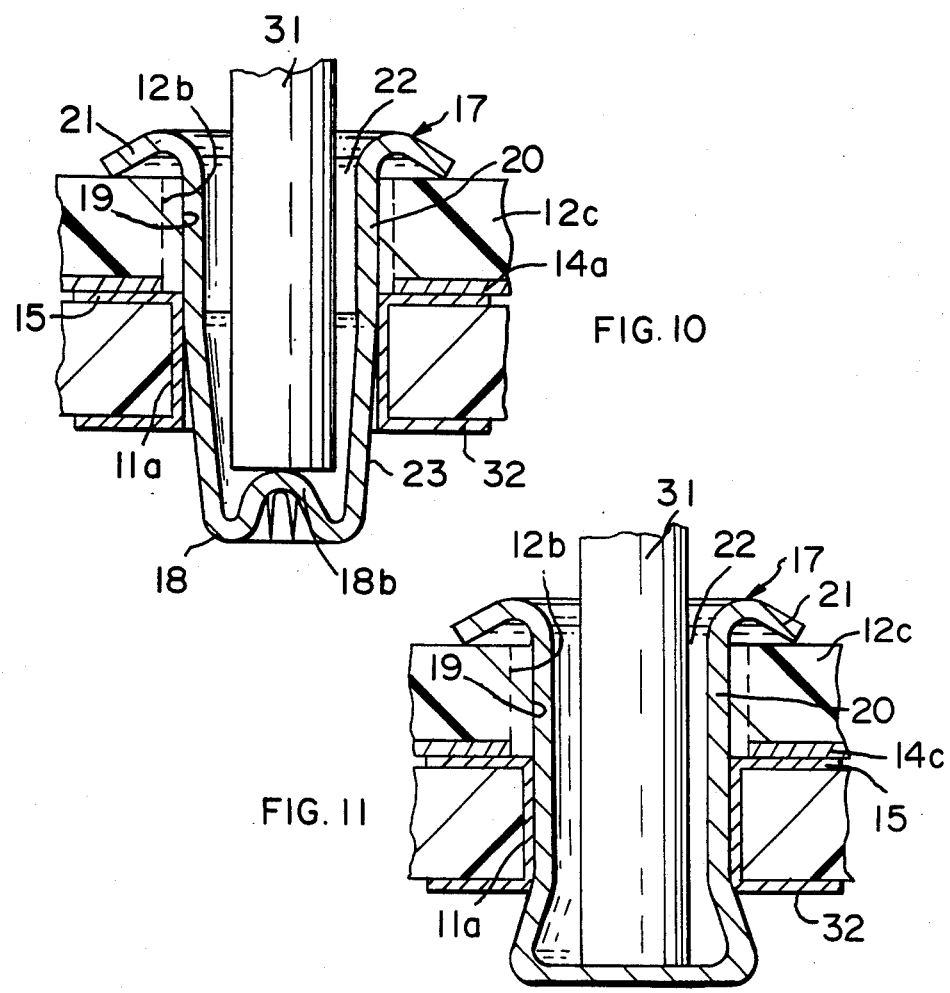

ELECTRICAL CONNECTOR AND ASSEMBLY EYELETS

FIELD OF THE INVENTION

This invention relates to electrical connectors which have improved means for assembly of same with a base structure, e.g., printed circuit board or any other mounting surface for the connector. More particularly, this invention relates to an electrical connector assembly which facilitates the final assembly of printed circuit boards. Still further, this invention relates to connectors such as D-connectors or Sub Miniature D-connectors which are pre-assembled with means for securing these to a printed circuit board, and thereafter the connector in its pre-assembled state is placed reliably, positively and precisely on a printed circuit board and secured thereon via top actuated means with low force and without damage to the printed circuit board.

Additionally, this invention relates to securing means which is in the form of a solderable eyelet having a particular configuration especially suited for pre-assembly and positive engagement with the connector housing and positive and highly secure engagement with the printed circuit board achievable through the top surface of the connector with low force, yet compatible with today's high rate sophisticated robotic assembly apparatuses without the use of under board tooling.

BACKGROUND OF THE INVENTION

In the assembly of connectors to printed circuit boards such as D-connectors, suitable apertures are provided in the D-connector housing to secure the connector to the printed circuit board in predetermined locations. These locations are sited before securing the connector to the board. Traditionally various riveting means or other devices such as threaded screws with or without appropriate lock nuts and the like have been used to secure the connector to the printed circuit board. Further ultrasonic welding or heat staking have been used as well as conventional solderable eyelets.

A number of shortcomings have become evident as increasingly higher assembly rates are being demanded in the competitive setting of today's electronic industry. Moreover, with increasing miniaturization, the printed circuit boards may not be assembled with the same force being exerted such as on the rivets or the speed of machinery has been rather limited, e.g., for the riveting or ultrasonic welding operation.

Still further, in riveting the precise placement of each of the rivets is required, as well as the precise hammer and anvil coordination. Thus, riveting introduces unwanted assembly problems, especially where the entire assembly of the printed circuit board is completed prior to reflow soldering or infrared soldering. As a result, low force for securing the connectors to the printed circuit boards has been a desideratum. Thus, various other means have been proposed instead of traditional riveting and the like. These other assembly means have been such as, e.g., threaded sleeves in a printed circuit board or in the connector and a threaded bolt. Threaded connections require more expensive devices as well as manipulation of the connector housing. The threaded devices require reverse side securing means with sleeves. Hence, use of the threaded devices has introduced complications which are not amenable to high speed assembly, not only from the time element, but also the cost element for the threaded device or securing means.

Still further, when searching for the proper aperture with a threaded device, because of the necessity for a positive engagement, the tolerances are fairly low and positive aperture location by means of the threaded devices is harder to achieve.

In addition, any time tooling is employed which must act from the top and the bottom, precise location problems are multiplied, not only for the one side but also for the other, thus further complicating the tooling or machine necessary for the assembly.

In the fastener art a number of devices have been used, but these are not applicable to securing of electrical connectors to a printed circuit board. For example, U.S. Pat. No. 3,015,140 to Pender shows a clip with a fastener. The fastener is formed from the clip and is essentially square. Hence, for locating and positioning in a hole, it is not very suitable. Further, upon engagement in a round hole, very little area bears against the hole walls. Thus, the engagement is not positive and is apt to do damage to the hole walls.

For the above reasons, the device disclosed in U.S. Pat. No. 3,015,140 is not acceptable.

BRIEF DESCRIPTION OF THE PRESENT INVENTION

The present invention is directed to an improved electrical connector, the securing means for it as well as the method of assembly such that the prior art problems discussed above are eliminated and/or minimized. A number of advantages are observed for the assembly or even individual component assembly. Thus, the improved securing means provide benefits such as precise location in apertures, positive engagement with high reliability, pre-assembled flexibility, as well as the benefits which are achieved by the reliable performance in final assembly due to the low force insertion and the securing operation, e.g., realized in the final assembly with a printed circuit board.

Inasmuch as considerably less metal needs to be displaced in the securing stage for the electrical connector to the printed circuit board, the force necessary for assembly is minimized to a considerable degree. Further reliability is gained for the pre-reflow soldered circuit boards containing unsoldered circuit board components. Additionally, the forces which are needed to bear on the securing device to achieve the securing operation are vastly less than the forces needed in riveting operations and the like. A still further advantage resides in the fact that all of the assembly steps can be achieved from the component side of the printed circuit board, and there is no need to turn around the printed circuit board for inspection or further working on it, as it may be necessary with some of the prior art devices.

BRIEF DESCRIPTION OF THE DRAWINGS

With reference to the drawings wherein various aspects of the invention have been described by way of example and illustrated wherein:

FIG. 1 illustrates in an orthogonal view a part printed circuit board with the electrical connector assembly placed thereon;

FIG. 2 illustrates partly in cross section showing the connector in a pre-assembly stage with an eyelet securing means;

FIG. 2a is a part top plan view of a mounting section of the connector housing and an aperture in which an eyelet is to be positioned;

FIG. 3 illustrates in an orthogonal view the securing means, that is, an enlarged eyelet prior to being reformed;

FIG. 4 is a view similar to FIG. 3 showing the eyelet in its reformed stage;

FIG. 5 is a cross sectional view of FIG. 4;

FIG. 6 is a bottom view of the eyelet shown in FIG. 4;

FIG. 7 is a cross section of an alternative embodiment of the eyelet;

FIG. 8 is a pre-assembly of the eyelet in a connector as a rear plan view of the connector shown in FIG. 1;

FIG. 9 is a rear plan view of the connector placed on a printed circuit board in the pre-securing position;

FIG. 10 illustrates in an enlarged cross-sectional view the pre-securing cross section of the eyelet shown in FIG. 2, including the tool used for the securing operation and FIG. 11 is a view similar to FIG. 10 showing the secured position of the connector with the eyelet on a printed circuit board.

DETAILED DESCRIPTION OF THE INVENTION

Turning now to FIG. 1, it illustrates assembly 10 comprising a printed circuit board 11, an electrical connector 12 which is for a typical D-connector having "D" section 13 and having an optional shield 14 thereon. Shield 14 has straps 14a that extend along bottom surfaces of mounting sections 12c of housing 12a which can serve as ground straps. Straps 14a are to be connected to conductive paths 15 which in the pre-completion stage may have a solder paste thereon before reflow soldering of the solder paste. D-section 13 for the connector housing has a front face 16. Eyelet 17 secures connector housing 12a to printed circuit board 11 prior to the soldering operation.

Although conductive path 15 has been shown along the top of circuit board 11, a similar conductive path may be located along the bottom of printed circuit board 11 and will be also electrically connected to eyelet 17 during the soldering operation. Terminating sections of the electrical terminals in housing 12a are also soldered to respective conductive paths on board 11 during such soldering operation.

FIG. 2 illustrates D-connector 12, including shield 14 and conductive path 15. Eyelet 17 is placed in apertures 12b of housing 12a which correspond to identical apertures 11a in printed circuit board 11.

As shown in FIG. 2a in order to place eyelet 17 in a secured position in the connector prior to final assembly, interference fit protrusions 19 are located within apertures 12b of housing 12a for engagement with eyelet 17. Typically, these interference protrusions 19 are in the form of projections or rims which may be placed either axially parallel to eyelet 17 or circumferentially inside apertures 12a, whereby a sufficient number of these interference fit protrusions or ribs are provided.

Protrusion 19 as a rim may be entirely circumferential, but typically they may be segmented, and thus protrusions 19 form a predeterminedly secure position for eyelet 17 based on the force necessary to frictionally secure eyelets 17 in apertures 12b of housing 12a. The use of protrusions 19 at 90° or 120° positions in apertures 12b center eyelets 17 therein, and they preferably extend along apertures 12b from the top to the bottom.

It is, of course, to be understood that, typically, D-connector housing 12 is made of a suitable plastic or dielectric material that has some resilience, i.e., material displacement. However, it has been found by experience that the interference fit must rely on displaceable plastic or components in the housing, such as in the form of projections and/or ribs circumferentially or longitudinally located within apertures 12b.

As shown in FIGS. 4 and 5, eyelet 17 comprises a hollow internal bore 22 which has a substantially straight cylindrical section 20 and a tapered section 23 terminating in a truncated section 18 which contains an excess amount of metal displaceable by splaying outwardly tapered section 23, as will be further explained in connection with FIG. 3. Flange or rim 21 is located at an upper end of eyelet 17.

Tapered section 23 has segments 24 formed by slots 24a extending to the lower part of tapered section 23. Although a number of segments 24 may be provided, it has been found by experience that three segments 24 circumferentially spaced equally around tapered section 23 suffice for imparting the necessary ability to truncated section 18 whereby the splaying of eyelet 17 can be achieved with positive and reliable engagement in a hole in printed circuit board 11.

In FIG. 4 a cross section along lines IV—IV has been further shown to illustrate in greater detail the slotted eyelet shown in FIGS. 2 and 3. Flange 21, as well as hollow bore 22, show the relationship vis-a-vis tapered section 23.

Slots 24a shown in FIG. 3 allows the formation of tapered section 23 which achieves a two-fold purpose. It allows the tapering of section 23 for the eyelet 17 to such a degree as necessary to achieve a positive locating feature relative to truncated section 18, and secondly, also splaying displacement of tapered section 23 vis-a-vis printed circuit board aperture 11a. Slots 24a allow sufficient tapering for tolerance to secure connector housing 12 to board 11. Tapered section 23 also enables such sections to be guided into holes 11a in circuit board 11. Still further, slots 24a provide for the reduction of the force necessary for the displacement of the truncated section 18 which contains reverse cone 18b protruding upwardly into the bore 22 which is formed by forcing cone 18a of FIG. 3 into bore 22 thereby forming tapered section 23 and reverse cone 18b as shown in FIGS. 4 and 5. Thus, slots 24a now have a double triangle shape with an outer large triangle shape along tapered section 23 and a small inner triangle shape extending from truncated section 18 to reverse cone 18b.

Although for eyelet 17, as previously mentioned, three slotted segments 24 have been shown, it has been found that the 120 degree separation provides a very positive engagement. Of course, more than three slotted segments 24 may likewise be used, but because of the size, these eyelets have limited space for the formation of segments 24.

Nevertheless, an important aspect as it concerns the present eyelet is the ability of slots 24a to provide a low force displacement of segments 24 and of reverse cone 18b in truncated section 18 in a predetermined manner based on the amount of metal in segments 24, the thickness of the metal, the size of cone 18b and/or the shape of slots 24a.

Cone 18b has been further illustrated in FIG. 6, showing the bottom view of the orthogonally shown eyelet in FIG. 4. This bottom view again shows the substantially cylindrical section 20 and tapered section 23, but also illustrates in further detail the relationship of slots 24a vis-a-vis the circumference of the eyelet around bore 22 thereof, including reverse cone 18b at the bottom of the eyelet which, however, is shown in further detail in FIG. 5.

Turning now to the assembly as shown in FIGS. 8–11, connector 12 such as an AMPLIMITE D-type connector is for mounting on printed circuit board 11. It is pre-assembled with eyelets 17 as shown in FIGS. 4–6 in apertures 12b, two of which have been shown in FIG. 8. The pre-assembled connector 12 with eyelets 17 therein is placed, such as by a robotic arm, on printed circuit board 11 with tapered sections 23 in apertures 11a as shown in FIG. 8 with terminating sections 30 of the electrical terminals in housing 12 in engagement with respective conductive paths on board 11; part of tapered sections 23 of eyelets 17 are disposed in respective apertures 11a of board 11 and straps 14a are in engagement with conductive paths 15 on board 11.

In FIG. 10, connector mounting apertures 12b and printed circuit board apertures 11a are shown in relationship to the substantially circular and cylindrical sections 20 of eyelet 17. Moreover, in FIG. 10 tapered sections 23 are clearly illustrated for their location in apertures 11a of printed circuit board 11.

Still further in FIG. 10, the actual assembly for the last step is shown with a staking pin 31 being inserted in the eyelet bore 22. Because of the slots 24a in slotted eyelet 17, the displacement of the reverse cone 18b in the bottom of the eyelet 17 (as illustrated in FIG. 10) is accomplished. Thus, the displacement of the metal in the eyelet is very readily achieved, as shown in FIG. 11 after the completion of the staking pin stroke, i.e., after staking pin 31 has pushed the reverse cone 18b out of the inner position and upset the truncated cone of the eyelet. The staking pin 31 thus splays the three or more segments 24 so that cone 18b is now substantially planar, locking these tightly and securely to the printed circuit board in a substantial engagement with it.

It is noted that the displacement, of course, is also a function of the metal characteristics, and the necessary malleability of this metal is achieved such as when using copper or copper alloys. However, other securing means may likewise be employed which have the necessary resiliency, especially if the reverse cone 18b is being pushed slightly past its flattened position as shown in FIG. 11 and wants to assume the flattened position due to its resiliency as shown in FIG. 11.

Further as shown in FIG. 11, a conductive path forming an electrical lead 32 may also be provided on the bottom of the printed circuit board which, upon solder reflowing, establishes adequate and proper contact with eyelet 17 at the bottom thereof.

In FIG. 7, eyelet 17a is similar to eyelet 17 except that section 30 is cylindrical rather than being tapered and section 30 is connected to cylindrical section 32 via tapered section 34. Section 30 is smaller than section 32 and acts as a guide for insertion into holes 11a of board 11 and when reverse cone 30b is deformed by a downward force applied by rod 31 of FIGS. 9 and 10, the bottom part of section 30 will be splayed against the bottom surface of board 11 adjacent holes 11a in the same manner as the bottom part of tapered section 23 of eyelet 17.

Although the description above has been with reference to a connector such as a D-connector, any other connector which may have the apertures for securing it to the printed circuit board may be usefully combined with the eyelets forming a pre-assembly. Numerous connectors are known in the art which would benefit by the pre-assembly and subsequent assembly of the connector to the printed circuit board and the benefits which are gained thereby have been enumerated above.

Conductive paths 15 and/or 32 generally form a ground connection to shield 14, but they can also be in the form of metallic areas to which straps 14a and eyelets 17 are soldered to positively secure connector 12 onto board 11.

As can be discerned, a unique eyelet has been disclosed which is frictionally mounted in apertures in a connector housing and has a reverse cone at a tapered bottom section that is engageable from a top position after the connector has been mounted on a printed circuit board causing the reverse cone to be splayed outwardly in engagement with a bottom surface of the circuit board adjacent the holes in which a bottom section of the eyelet is disposed.

What is claimed is:

1. An electrical connector assembly for mounting to a printed circuit board comprising:
   a dielectric housing having an integral flange having a mounting face for engaging the printed circuit board, an opposed holding face and an aperture extending therebetween;
   an eyelet disposed in said aperture, said eyelet comprising flange means engaging the holding face, an inverted end remote from said flange means and a generally tubular shank extending therebetween, the generally tubular shank having a bore, a first section within the aperture for providing an interference fit therewith, and a second section extending below the mounting face for disposition within an aperture of the printed circuit board, said inverted end extending inwardly from the second section, said inverted end being engagable through the bore of the generally tubular shank, whereby when the connector assembly is positioned on the printed circuit board with the second section in an aperture in the printed circuit board, and the inverted end is driven outwardly, such as by a rod inserted axially within the bore of the generally tubular shank, the second section is expanded into engagement with the printed circuit board so as to secure the connector assembly to the printed circuit board.

2. An electrical connector assembly as recited in claim 1 wherein the inverted end is conical in shape.

3. An electrical connector assembly as recited in claim 1 wherein the housing aperture further comprises projection means frictionally engaging the first section of the generally tubular shank.

4. An electrical connector assembly as recited in claim 1 wherein the generally tubular shank has slots therein forming segments.

5. An electrical connector assembly as recited in claim 4 wherein the shank is comprised of three segments.

6. An electrical connector assembly as recited in claim 1 wherein the generally tubular shank is cylindrical.

7. An electrical connector assembly as recited in claim 1 wherein said second section is tapered.

8. An electrical connector assembly as recited in claim 1 further comprising:

an electrically conductive shell on said housing, said shell having ground strap means extending along the mounting face, the ground strap means having an aperture through which the generally tubular shank extends, whereby when the connector assembly is positioned on the printed circuit board with the second section in an aperture in the printed circuit board, and the inverted end is driven outwardly, such as by a rod inserted axially within the bore of generally tubular shank, the second section is expanded into engagement with the printed circuit board so as to secure the connector assembly and the shell to the printed circuit board.

9. An eyelet for use in mounting an electrical connector assembly to a printed circuit board wherein the electrical connector assembly includes a connector housing with a flange having a mounting face for engaging the printed circuit board, an opposed holding face and a mounting aperture extending therebetween, and the printed circuit board has an aperture for receiving a portion of the eyelet, the eyelet comprising flange means and a generally tubular shank, the generally tubular shank having a bore, a first section adapted to be received in the mounting aperture of the connector housing in an interference fit, and a second section adapted to extend below the mounting face of the connector housing and further adapted to extend beyond the connector housing for disposition in an aperture in the printed circuit board, the generally tubular shank having said flange means at one end thereof adapted to engage the holding face of the connector housing, said tubular shank having an inverted end at the other end thereof, said inverted end engagable through the bore of the generally tubular shank.

10. An eyelet as recited in claim 9 wherein the second section is tapered.

11. An eyelet as recited in claim 9 wherein the second section is of a smaller diameter than the first section.

12. An electrical connector assembly including means for securing the connector assembly to a base, comprising:
a connector housing having an aperture for securing said connector housing to a base, and
an eyelet disposed within said aperture, said eyelet having first and second ends and comprising:
a securing fit section disposed within said aperture in an interference fit,
a flange at the first end of said eyelet for engaging a surface of said connector housing, and
a tapered, splayable portion at the second end of said eyelet for insertion into an aperture in said base for securing said connector assembly to said base, whereby when the splayable portion is widened the connector assembly is secured to the base.

13. An electrical connector assembly as recited in claim 12, wherein the interference fit aperture of said connector housing is cylindrical and includes interference fit sections therein for engagement with said eyelet.

14. An electrical connector assembly as recited in claim 12, wherein the connector housing contains at least two apertures and wherein each aperture has an eyelet disposed therein, said eyelets in said apertures protrude with a tapered section extending beyond said connector housing for location in an aperture in a printed circuit board.

15. A method of mounting and securing an electrical connector onto a printed circuit board, comprising the steps of
inserting an eyelet into an aperture of a dielectric housing of the electrical connector, the eyelet comprising flange means and a generally tubular shank, the generally tubular shank having a bore, a first section adapted to be received in the mounting aperture of the connector housing in an interference fit, and a bottom section adapted to extend below the mounting face of the connector housing and further adapted to extend beyond the connector housing for disposition in an aperture in the printed circuit board, the generally tubular shank having said flange means at one end thereof adapted to engage the holding face of the connector housing, said tubular shank having an inverted end comprising an inwardly directed section at the other end thereof;
positioning the electrical connector onto the circuit board with the bottom section of the eyelet being disposed within a hole of the circuit board;
inserting a rod into the eyelet into engagement with the inwardly-directed section thereby driving the inwardly-directed section downwardly causing the bottom section to expand against the bottom of the board so as to secure the electrical connector onto the board.

16. A method as claimed in claim 15, wherein the eyelet has slots therein forming segments which require less force to expand the bottom section.

17. A method as claimed in claim 15, wherein the housing aperture has projections thereby frictionally engaging the eyelet.

* * * * *